United States Patent
Brophy et al.

(10) Patent No.: US 6,649,832 B1
(45) Date of Patent: Nov. 18, 2003

(54) APPARATUS AND METHOD FOR COUPLING WITH COMPONENTS IN A SURFACE MOUNT PACKAGE

(75) Inventors: Brenor L. Brophy, San Jose, CA (US); James H. Lie, San Jose, CA (US); Andrew J. Wright, Mountain View, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/944,874

(22) Filed: Aug. 31, 2001

(51) Int. Cl.[7] .................................................. H05K 5/06
(52) U.S. Cl. ..................... 174/52.2; 257/680; 257/738; 257/787
(58) Field of Search .............................. 174/52.2, 52.4; 361/761; 257/787, 788, 680, 681, 433, 434, 738

(56) References Cited

U.S. PATENT DOCUMENTS

| | | | | |
|---|---|---|---|---|
| 4,136,357 A | * | 1/1979 | Frederiksen | 257/434 |
| 4,439,006 A | * | 3/1984 | Stevenson | 385/88 |
| 5,438,216 A | * | 8/1995 | Juskey et al. | 257/434 |
| 5,872,331 A | * | 2/1999 | Ando et al. | 174/35 R |
| 6,307,258 B1 | * | 10/2001 | Crane, Jr. et al. | 257/680 |

* cited by examiner

Primary Examiner—Hung V. Ngo
(74) Attorney, Agent, or Firm—Wagner, Murabito & Hao LLP

(57) ABSTRACT

An embodiment of the present invention provides a method and apparatus that effectuates a direct functional interface directly with individual constituent subcomponents of the internal die component, or with particular circuit nodes or conductive trace locales of the surface mount package, without high frequency signal degradation or other electrical problems. An embodiment of the present invention also provides a method and apparatus that effectuates testing access, directly to the internal die component of the surface mount package or to a particular circuit node or conductive trace locale of the surface mount package, enabling performance evaluation and system debugging. Further, an embodiment of the present invention provides a method and apparatus that effectuates integration of surface mount package with an opto-electronic package. Further still, an embodiment of the present invention provides a method and apparatus that achieves these advantages with minimal cost.

14 Claims, 13 Drawing Sheets

APPARATUS AND METHOD FOR COUPLING WITH COMPONENTS IN A SURFACE MOUNT PACKAGE

BACKGROUND OF THE INVENTION

1. Field of the Invention

The present invention relates to the field of electronic packaging. Specifically, the invention is an apparatus and method for coupling with an internally packaged component and/or connection on the die and/or substrate of a surface mount package.

2. Related Art

As electronic systems miniaturize and system operating frequencies rise, connection lengths and packaging become important aspects of full system performance. Short connection lengths and compact packaging are advantageous. Electrical design facilitating high performance at high frequencies is crucial. Interfaces effectuating data transfer at high frequencies without signal degradation, optical transceivers and other devices enabling signal exchange between electronic and optical media, and testing access enabling performance evaluation and system debugging are all desirable.

Modern electronic packaging of integrated circuits (IC) and other semiconductor devices is trending toward higher densities on more compact packages with higher numbers of external connections, commonly surface mounted on and connected to a printed circuit boards (PCB). One such surface mount package is the common lead frame package. Another, offering electrical advantages at the high frequencies becoming common, is the ball grid array (BGA).

A BGA includes a substrate onto which a pattern of conductive traces, typically covering the full surface of the substrate, and bonding pads are printed. The traces are also electrically connected to bonding pads on the bottom of the substrate. The bonding pads are masked, solder mask material is then deposited over the entire top surface, and the mask material is then removed such that the bonding pads are exposed. A hard protective layer may be deposited on the bonding pads, so as to harden their surface to facilitate wire bonding.

A die, which may be an IC or other semiconductor device, is mounted atop the substrate, and wire bonded to its upper bonding pads, electrically connecting the die to the bonding pads. The die, and all but a part of the remaining exposed top of the substrate, is covered by a molded cover. Typically, the cover compound is an organic biphenyl polymer, another plastic or other polymer, or a ceramic. The resulting structure is then trimmed, typically by cutting, at all edges of the substrate.

Conductive appurtenances, such as solder balls, are typically arrayed over the bottom surface of the substrate, electrically connected to the array of bonding pads thereon. The solder balls or other connectors are thereby connected to the IC or other semiconductor device constituting the die. Through the solder balls or other appurtenances, the IC or other semiconductor device constituting the die may be simultaneously surface mounted and electrically connected to appropriate contacts printed, typically in an array, on a PCB.

Other surface mount packages, such as the chip scale package (CSP) are becoming part of trend in electronic packaging, offering increases in electronic density and physical compactness. There are lead frame CSPs; there are also BGA chip scale packages (BGACSP), such as array molded BGA, fine pitch BGA, and micro BGA. Other relevant modern surface mount packages include the flip chip, quad FlatPack (QFP), thin QFP (TQFP), ceramic QFP (CQFP), small profile QFP (SQFP), and plastic QFP (PQFP). These surface mount packages are well known in the art.

Optical transceivers, and other opto-electronic devices enabling signal exchange between electronic and optical media are often packaged discretely, or in relatively low-scale integration packages. Typically, they have relatively few connecting pins or other connection modalities. Optically active components, such as a photodiode (PD) and a laser diode (LD), are often packaged, sometimes together, integrated with supporting electronics, such as an amplifier and a laser driver and Peltier cooler, on a ceramic substrate. A quartz, glass, or other, wavelength-appropriate window, is mounted thereto. A metallic cover is soldered on, hermetically sealing the device.

Optical transceivers are integral parts of many electronic data systems, where they receive control and data for transmission from and send feedback and data received to logic devices such as a serializer/deserializer (SERDES). Optical transceivers, typically with relatively few connecting pins, are either mounted directly upon a printed circuit board (PCB), or connected via a socket, which is itself mounted directly upon the PCB. In the conventional arrangement, pins of the optical transceiver are connected, individually, to a SERDES device or another logic chip, typically with a larger number of connections than the optical transceiver. Optical transceivers, due to the short service lives of their lasers relative to other system components or due to a change in application, such as from short to long haul transmission, may require replacement before other system components.

While effectuating data transfer at high frequencies is somewhat improved by the SMP, and optical transceivers enabling signal exchange between electronic and optical media may be used in conjunction with them, the conventional art is problematic.

Direct functional interfacing with individual constituent subcomponents of the internal die component or with particular circuit nodes or conductive trace locales of the SMP, without high frequency signal degradation and other serious electrical problems, is particularly difficult. This is one major drawback of the conventional art. Another is that testing access, directly to the internal die component of the SMP or to a particular circuit node or conductive trace locale of the SMP, enabling performance evaluation and system debugging, is all but impossible. Both direct functional interfacing and providing direct testing access with individual constituent subcomponents of the internal die component or with particular circuit nodes or conductive trace locales of the SMP, has not been fully achieved in the conventional art. Substitutes conventionally used are costly, somewhat ineffective, and applied substantially ad hoc. Further, high frequency electrical performance suffers.

Mounting and connecting optical transceivers to PCBs conventionally leaves an inordinately large footprint upon the PCB. Typically, optical transceivers are relatively large, physically. Further, the mismatch between their relatively low number of connection pins and the relatively high number of connections required by SERDES and other data transfer logics poses an electrical routing problem, leaving an even larger PCB footprint, and precluding fully functional integration with the SERDES. Sockets, used to allow changeability of the optoelectronic device, tend to degrade high frequency signals. Also, conventional optoelectronic packaging is relatively expensive.

What is needed is a method and/or apparatus that effectuates a direct functional interface directly with individual constituent subcomponents of the internal die component, or with particular circuit nodes or conductive trace locales of the surface mount package (SMP), without high frequency signal degradation or other electrical problems. What is also needed is a method and/or apparatus that effectuates testing access, directly to the internal die component of the SMP or to a particular circuit node or conductive trace locale of the SMP, enabling performance evaluation and system debugging. Further, what is needed is a method and/or apparatus that effectuates integration of SMP with an opto-electronic package. Further still, what is needed is a method and/or apparatus that achieves these advantages with minimal cost.

SUMMARY OF THE INVENTION

An embodiment of the present invention provides a method and apparatus that effectuates a direct functional interface directly with individual constituent subcomponents of the internal die component, or with particular circuit nodes or conductive trace locales of the surface mount package, without high frequency signal degradation or other electrical problems. An embodiment of the present invention also provides a method and apparatus that effectuates testing access, directly to the internal die component of the surface mount package or to a particular circuit node or conductive trace locale of the surface mount package, enabling performance evaluation and system debugging. Further, an embodiment of the present invention provides a method and apparatus that effectuates integration of surface mount package with an opto-electronic package. Further still, an embodiment of the present invention provides a method and apparatus that achieves these advantages with minimal cost.

The present invention provides, in one embodiment, a method and apparatus that effectuates a direct functional interface capability through an access portal, such as a hole penetrating the molded compound covering the die. Interfacing may be made directly with individual constituent subcomponents of the internal die component, or with particular circuit nodes or conductive trace locales of the surface mount package (SMP), without high frequency signal degradation or other electrical problems.

In one embodiment, the interface may be electrical. The direct interface may be effectuated by pogo pins, fuzz balls, metallic dendrites, and other electrical connection modalities with low impedance and other high-performance attributes for high frequencies. In one embodiment, the direct electrical interface may be made permanent, semi-permanent, or temporary. The electrical connection effectuating the interface may be extended through the hole from outside of the surface mount package, to an individual constituent subcomponents of an internal die component, or with particular circuit nodes or conductive trace locales on the substrate.

In one embodiment, the interface may be an optical one. A laser beam or other light-based signal, from an external source may illuminate a photodetector diode embedded within the die. Conversely, an internally die-embedded laser diode may emit light to an external receptor. In both instances, the optical access is through a hole or other optically transparent aperture penetrating the molded compound covering the die, effectuating direct functional interface capability.

In one embodiment, the present invention provides a method and apparatus that effectuates testing access, directly to the internal, die subcomponent of the SMP or to a particular circuit node or conductive trace locale of the SMP, enabling performance evaluation and system debugging. Direct access for a testing medium is effectuated through a hole penetrating the molded compound covering the die and substrate.

In one embodiment, an electrical probe may be inserted through the hole to physically touch and electrically interact with an individual internal die subcomponent of the SMP, and/or to particular circuit nodes or conductive trace locales therein. In one embodiment, a high-impedance testing medium may be used. One such medium applicable is an electron beam, such as emitted by an E-beam test source, directed through the hole in the molded compound covering the die and substrate. In one embodiment, the testing may be conducted optically. A laser beam or other light source may be directed at a photoreceptive internal component, or generated by an internal laser or other light emitter in response to an electrical test signal.

Further, the present invention provides a method and apparatus that effectuates integration of SMP with an opto-electronic package. In one embodiment, a discretely packaged optical transceiver is mounted on and coupled to an SMP. In one embodiment, opto-electronic devices such as laser and photodetector diodes, may be integrated internally to the SMP, such as subcomponents of the IC die within the IC. The opto-electronic devices are optically interfaced via the hole or other optically transparent aperture penetrating the molded compound covering the die and substrate. In one embodiment, integrating a discretely packaged optical transceiver by mounting and coupling it, via the hole or other optically transparent aperture penetrating the molded compound covering the die and substrate, to the SMP, is effectuated. In one embodiment, the coupling of the optical transceiver with the SMP is electrical. Advantageously, this arrangement, which includes very short, direct connections, offers high electrical performance at high frequencies. In another embodiment, the optical transceiver is optically coupled through the hole or other optically transparent aperture.

Further still, the present invention provides a method and apparatus that achieves these advantages at minimal cost. The molded compound for covering the die and substrate of the SMP may be fabricated with pre-molded holes with very little effect on the overall manufacturing cost. No additional components are necessary. Further, packaging opto-electronic devices as subcomponents of the IC die, and interfacing with the optoelectronic devices optically via the holes in the cover of the SMP offers substantially lower costs than conventional packaging of these devices.

These and other objects and advantages of the present invention will become obvious to those of ordinary skill in the art after reading the following detailed description of the preferred embodiments, which are illustrated in the various drawing figures.

DETAILED DESCRIPTION OF THE INVENTION

In the following detailed description of the present invention, a surface mount package and a method for forming a surface mount package, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have not been described in detail as not to unnecessarily obscure aspects of the present invention.

Figure 1:
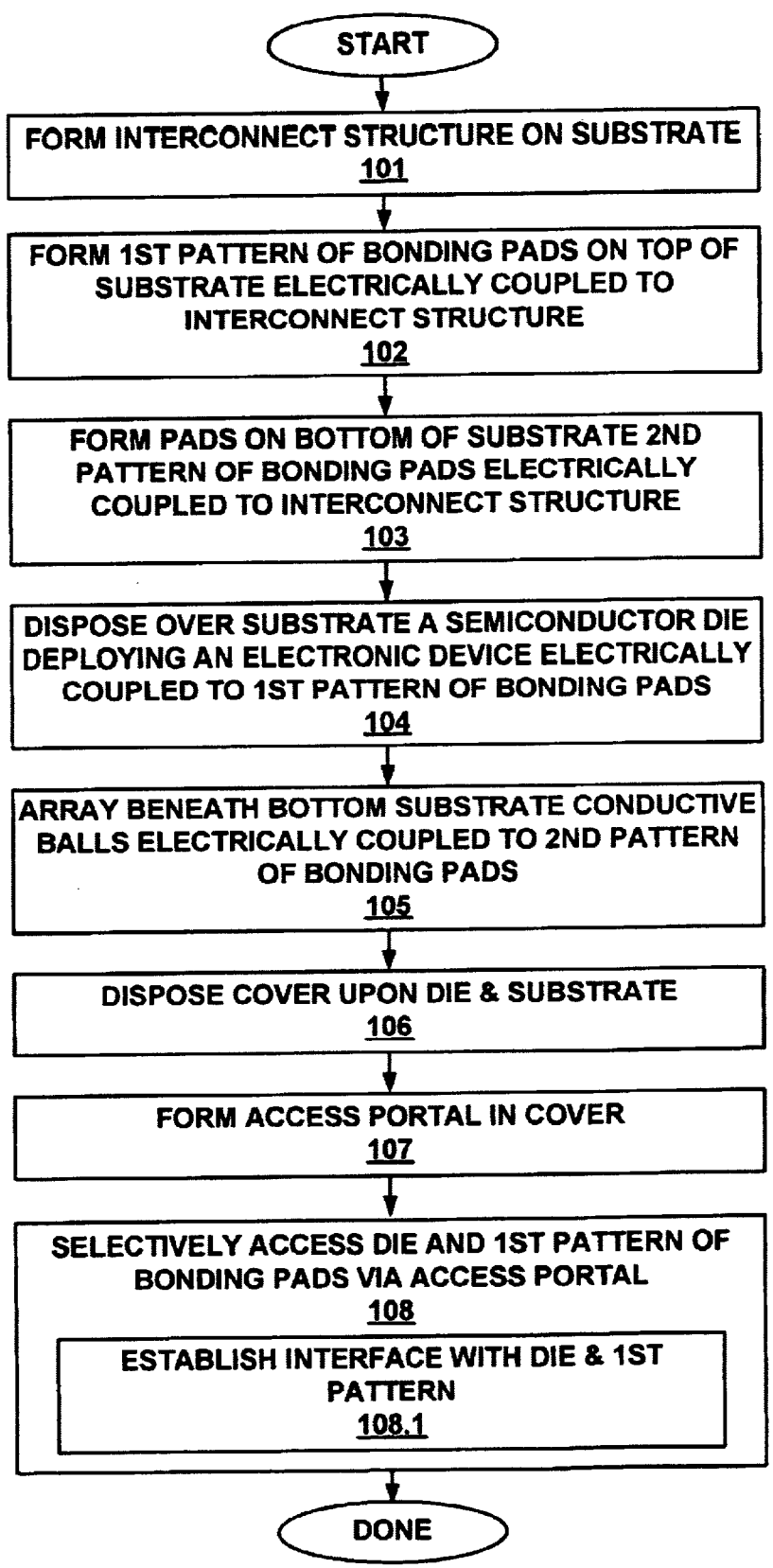
FIG. 1 is a flow chart illustrating the steps in a method for forming a surface mount package in accordance with an embodiment of the present invention.

FIG. 1 shows a method for executing the steps in a process 100 for forming a surface mount package, deploying an improvement, for containing a semiconductor device in accordance with one embodiment of the present invention. Particular components referred to in FIG. 1 and the present discussion are described in detail in subsequent figures and corresponding discussions below. Although specific steps are disclosed herein and in FIG. 1 for process 100, such steps are exemplary. That is, the present invention is well suited to performing various other steps or variations of the steps recited herein and in FIG. 1. Further, the steps of process 100 disclosed herein and in FIG. 1 may effectively be performed in an order varying from the order described.

Beginning with step 101, an interconnect structure is formed on a substrate. The interconnect structure electrically connects the device to be housed in the surface mount package to the conductive connecting balls of the surface mount array.

Continuing with FIG. 1, as shown by step 102, a first pattern of bonding (e.g., contact) pads are formed over the top surface of the substrate. The contact pads electrically couple (e.g., connect) to the interconnect structure. In the present embodiment, step 102 is performed contemporaneously with step 101. More particularly, the contact bonding pads are formed during the formation of the interconnect structure.

A non-conducting layer covers the substrate. In the present embodiment, the non-conducting layer is solder mask material that includes openings that overlie the contact pads. In the present embodiment, the layer of solder mask is deposited and is masked and etched to form openings that overlie the contact pads.

As shown by step 103, a second pattern of bonding pads is formed on the bottom surface of the substrate in a manner similar to that in which the first pattern was formed upon the top of the substrate (e.g., step 102).

In step 104, a semiconductor die deploying an electronic device is disposed over the substrate. The electronic device deployed therein is electrically coupled to the first pattern of bonding pads.

In step 105, conductive appurtenances, in one embodiment solder balls, are arrayed on the bottom of the substrate. The conductive balls enable the surface mount package to be mounted upon a printed circuit board (PCB) and electrically coupled to the circuits thereon. The conductive balls are electrically coupled to the second pattern of bonding pads. Via the interconnect structure and the first and second pattern of bonding pads, the electronic device deployed upon the semiconductor die is effectively electrically coupled to the array of conductive appurtenances. In this manner, the electronic device may be electrically coupled within the circuits on a PCB.

A cover is disposed upon the die and substrate; step 106. The cover may be composed, in one embodiment, of a moldable substance such as a plastic or other polymer. In one embodiment, an organic biphenyl polymer is used to mold the cover which is disposed upon the die and substrate. Covers may also be composed of other materials, such as ceramic, glass, quartz, mica, or metal. Metal covers may require application of layers of electrical insulation.

An access portal, such as a hole, is formed in the cover; step 107. The access portal may be formed by molding, as when a molded cover is fabricated, for example in an injection molding or extrusion process. Thus, step 107 may, in one embodiment, be performed prior to or in conjunction with step 106. In one embodiment, the access portal may be drilled, punched, melted, or otherwise formed by penetrating a cover.

The access portal allows selective direct access to the die and first pattern of bonding pads underlying the cover in the surface mount package; step 108. The access portal is an improvement to surface mount packages, which conventionally allowed no such access.

This selective access allows, in one embodiment, the establishment of an interface with the die and first pattern of bonding pads; step 108.1. The interface may allow interfacing for applications such as signal transfer, for instance, for exchange of data. The interface may also effectuate a testing access, enabling performance evaluation and system debugging.

Interfaces may be effectuated by electrical and/or optical interface media. The interface may be permanent, semipermanent, or temporary.

The surface mount array is completed. In the present embodiment, the surface mount array is completed using the conventional steps of forming a housing over the top of the substrate, trimming the substrate and forming conductive balls, on the bottom surface of the substrate. Thereby, a surface mount package is formed having conductive balls that are electrically coupled to the electrical device housed within the surface mount package.

Figure 2A:
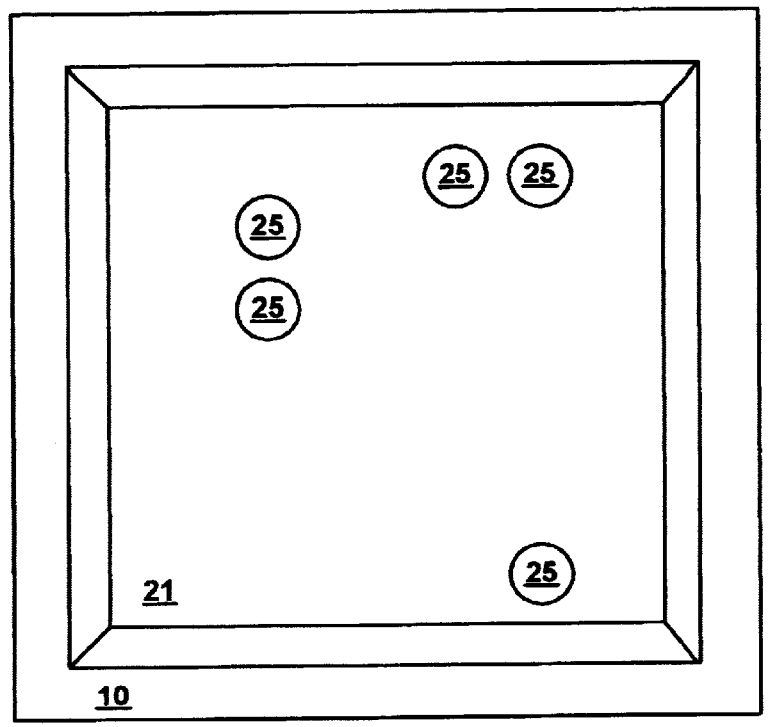
FIG. 2A is an illustration of a top perspective view of a surface mount package deploying an improvement, in accordance with an embodiment of the present invention.
Figure 2B:
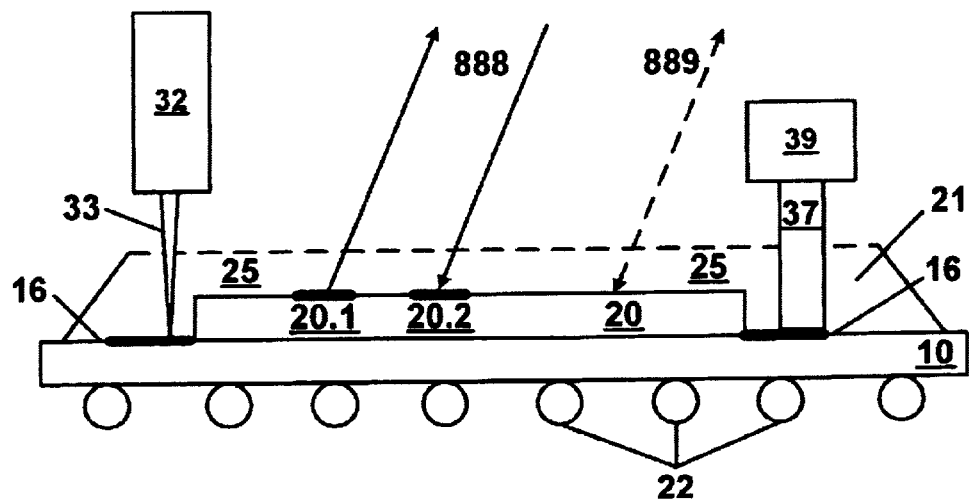
FIG. 2B is cut-away view of a surface mount package deploying an improvement enabling access to internal components, effectuated by a number of media, in accordance with an embodiment of the present invention.

FIG. 2A shows a top perspective of a surface mount package (SMP) 200A displaying an improvement, in accordance with one embodiment of the present invention. A substrate 10, substantially rectangular, supports cover 21 and underlying components (e.g., semiconductor die 20 and bonding pad 16; FIG. 2B). Cover 21 is disposed over substrate 10 and the underlying components, and is fixedly attached to substrate 10. In the present embodiment, SMP 200A is an exemplary BGA, but exemplifies any SMP.

Cover 21 is composed, in one embodiment, of a moldable substance such as a plastic or other polymer. Covers may also be composed of other materials, such as ceramic, glass, quartz, mica, or metal. Metal covers may require application of layers of electrical insulation. In the present embodiment, cover 21 is molded from an organic biphenyl polymer. Cover 21, in the present embodiment, forms a truncated pyramid, substantially rectangular at its base, which is in contact with substrate 21, and having beveled trapezoidal sides and a substantially rectangular top, conforming proportionally to the base.

Cover 21 has an access portal 25, such as a hole. In the present embodiment, five holes each provide separate access portals 25. Any number of access portals may be formed into cover 21, arrayed as required by the application. Access portals 25 may be formed by molding, as when a molded cover 21 is fabricated, for example in an injection molding or extrusion process. In one embodiment, the access portal may be drilled, punched, melted, or otherwise formed by penetrating a cover. Access portals 25 each allow selective direct access to a component underlying cover 21 (e.g., die 20 and bonding pads 16; FIG. 2B). Thus, the access portal is an improvement to surface mount packages, which conventionally allowed no such access. The access allowed is direct and short, which is significantly advantageous in effectuating interfaces with underlying components and external interfacing agents (e.g., probe 32 and system component 39; FIG. 2B).

Referring to FIG. 2B, surface mount package 200B is viewed from a cut away side perspective. Beneath substrate 10 is an array of conductive appurtenances 22, such as solder balls, which enable surface mount package 200 to be mounted upon a PCB and electrically coupled to circuits thereon. In the present embodiment, SMP 200B is an exemplary BGA, but exemplifies any SMP.

Figure 4:
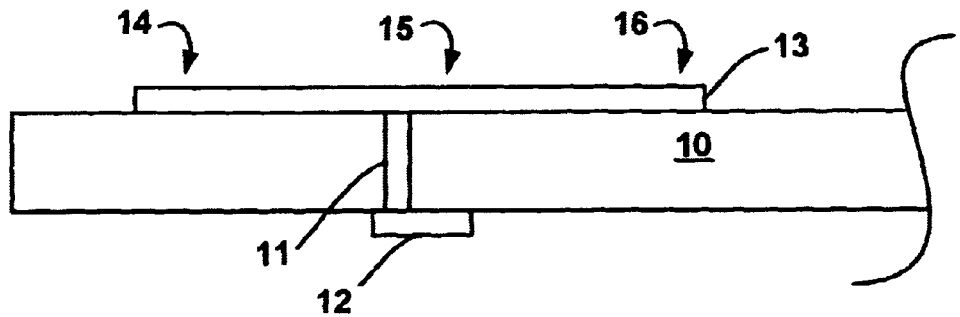
FIG. 4 is a side cross-sectional cut-away view of the structure of FIG. 3 after an exemplary bonding pad, contact pad and trace have been formed thereover in accordance with an embodiment of the present invention.

Mounted upon substrate 10 is a semiconductor die 20, deploying an electronic device, including a surface emitting laser diode 20.1 and a surface sensing photodetector diode 20.2. Semiconductor die 20 is wire bonded to bonding pads 16, electrically coupling therethrough and other components (e.g., interconnect structure 11; FIG. 4) to conducting balls 22, effectuating electrical coupling therethrough to circuits on a PCB mounting surface mount package 200.

Cover 21 covers die 20, bonding pads 16, and part or all of the upper surface of substrate 10. Cover 21 has a number of access portals such as holes 25 penetrating it. Advantageously, access portals 25 allow direct access to underlying components, such as die 20 and bonding pads 16. In the present illustration, seven access portals penetrate cover 21. This is an improvement over conventional surface mount packages, which allowed no such access.

The access allowed is direct and short, which is significantly advantageous in effectuating selective interfacing between underlying components (e.g., semiconductor die 20 and bonding pads 16) and external interfacing agents. Specifically, electrical interfaces with good electrical performance at high frequencies, and/or short, direct, unimpeded line-of-sight optical interfaces are effectuated. These interfaces may allow interfacing for applications such as signal transfer, for instance, for exchange of data. The interface may also effectuate a testing access, enabling performance evaluation and system debugging. Interfaces may be effectuated by electrical and/or optical interface media. The interface may be permanent, semipermanent, or temporary.

In the present embodiment, five interfaces are illustrated as functioning, through five of the seven access portals 25. A digital logic analyzer 32 is electrically coupled by a test probe 33 to one of the bonding pads 16 via one of the access portals 25. This exemplifies a temporary electrical interface for testing and/or debugging purposes.

Pogo pins, especially solid (e.g., non-spring-loaded) pogo pins are have particularly good electrical performance characteristics at high frequencies (e.g., in the range between 1 and 10 gHz), as do fuzz balls, metallic dendrite connectors, and elastomerically suspended gold wire grids. In the present embodiment, a pogo pin 37, electrically coupled to the other illustrated bonding pad 16, enables an interface with a system component 39. This exemplifies an electrical interface for signal transfer, such as data exchange, which may be permanent, semi-permanent, or temporary, which is transmitted without coupling required via solder balls 22 and PCB circuits connected thereto.

In one embodiment, pogo pin 37 may be connected directly to a component of the electronic device deployed by semiconductor die 20. In one embodiment, system component 39 may be an optical transceiver. Optical transceiver 39 may also be optically coupled via optical coupling media through access portals 25.

Optical coupling via access portals 25 is illustrated by transmission, by laser diode 20.1, and by reception, by photodetector diode 20.2, both deployed on semiconductor die 20, of laser beams 888. Electrical coupling directly to semiconductor die 20 and the electronic devices deployed thereon, such as individual transistors and/or circuit nodes, such as for testing and/or debugging, is especially advantageous when effectuated by modalities that have little electrical or other physical effect on the components to which they interface. Extremely high impedance modalities are particularly useful in this regard. One such modality is a beam of electrons emitted and/or received by specialized external testing agents. An exemplary electron beam 888, also referred to as an "E-beam," is depicted as accessing a particular point 20.2 on the surface of semiconductor die 20 via an access portal 25.

Figure 2C:
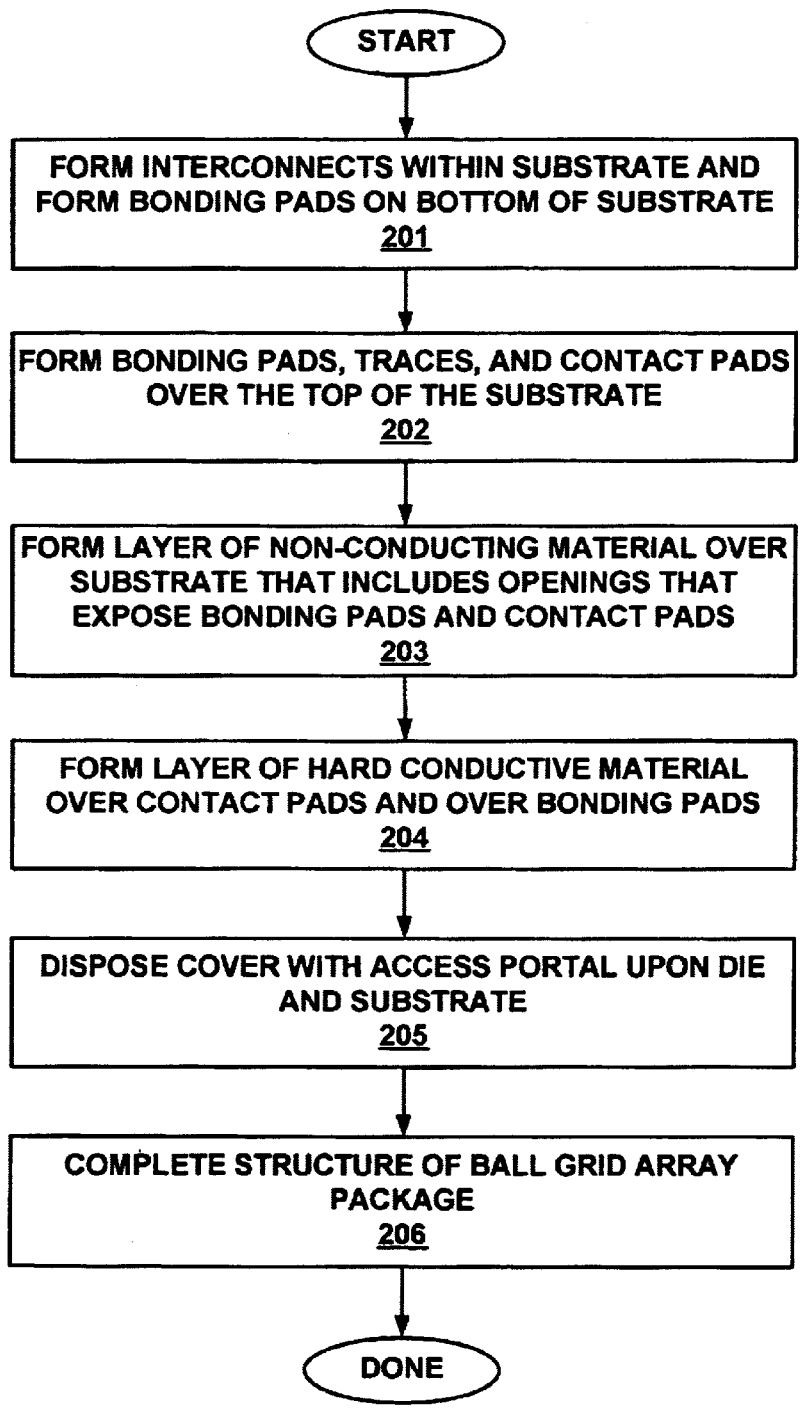
FIG. 2C is a flow chart of the steps in a process, illustrating a more detailed method for forming a ball grid array package in accordance with an embodiment of the present invention.

FIG. 2C shows a more detailed method 200C for forming a surface mount package in accordance with one embodiment of the present invention. In the present embodiment, process 200C forms an exemplary BGA, but exemplifies formation of any SMP. Although specific steps are disclosed herein and in FIG. 2C for process 200C, such steps are exemplary. That is, the present invention is well suited to performing various other steps or variations of the steps recited herein and in FIG. 2C. Further, the steps of process 200C disclosed herein and in FIG. 2C may effectively be performed in an order varying from the order described.

Figure 3:
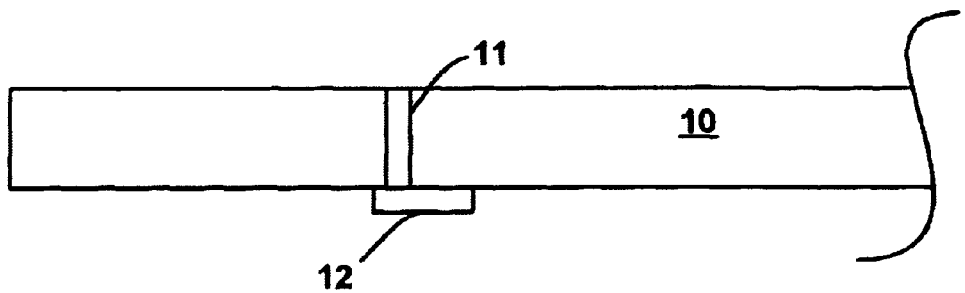
FIG. 3 is a side cross-sectional cut-away view of a portion of a substrate on which an interconnect and a bonding pad have been formed in accordance with an embodiment of the present invention.

First, interconnects are formed within a substrate and bonding pads are formed on the bottom surface of the substrate as is shown by step 201. FIG. 3 shows an exemplary cut-away view of a portion of a substrate 10 after an interconnect 11 has been formed therethrough and after bonding pad 12 has been formed. Any of a number of known methods can be used to form interconnect 11 and bonding pad 12. In one embodiment of the present invention, a layer of copper is deposited, masked and etched to form interconnect 11 and bonding pad 12.

Referring now to step 202 of FIG. 2C, bonding pads, traces and contact pads are formed over the top of the substrate. In the present embodiment, a layer of conductive material is deposited, masked and etched to form bonding pads, traces and contact pads. FIG. 4 shows a cut-away view of a portion of a substrate 10 after a layer of conductive material has been deposited, masked and etched to form conductive layer 13. In the present embodiment, copper is used to form conductive layer 13. However, conductive layer 13 could be made from other conductive materials such as, for example, gold, silver, etc. For wire bonding, hard surfaces such as gold alloys with nickel and other metals are particularly advantageous.

Figure 5:
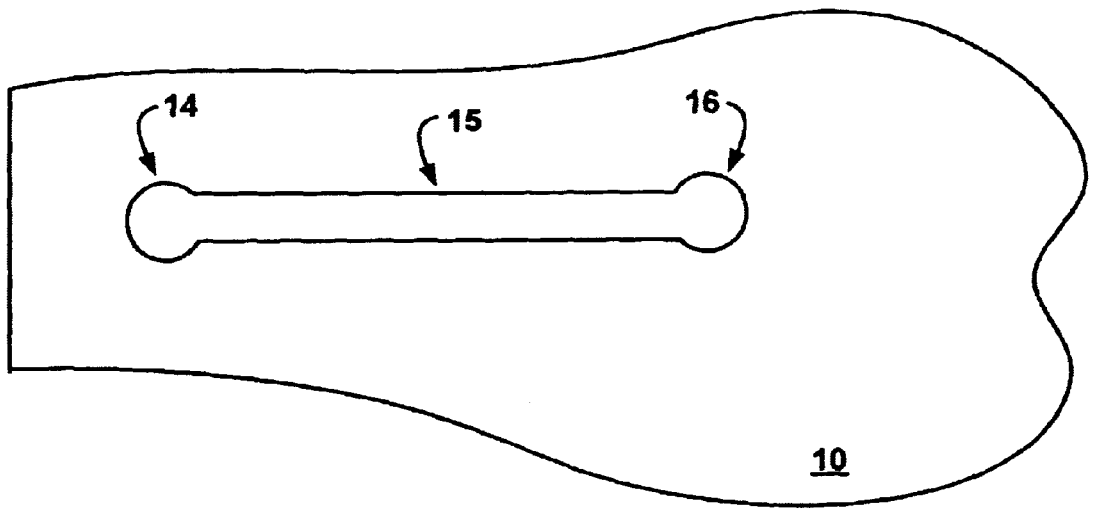
FIG. 5 is a top view of the structure of FIG. 4 in accordance with an embodiment of the present invention.

Referring now to FIGS. 4–5 it can be seen that bonding pad 16, contact pad 14 and trace 15 are formed within conductive layer 13. Bonding pad 16 is electrically connected with contact pad 14 by trace 15. Bonding pad 16 is electrically coupled with bonding pad 12 via trace 15 and interconnect 11.

Figure 6:
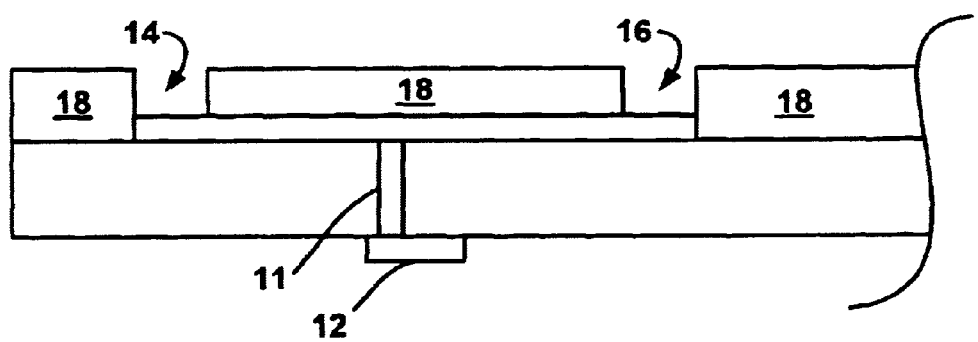
FIG. 6 is a side cross-sectional cut-away view of the structure of FIG. 4 after a non-conducting layer has been formed thereover that includes openings that extend over the bonding pads and openings that extend over the contact pads in accordance with an embodiment of the present invention.
Figure 7:
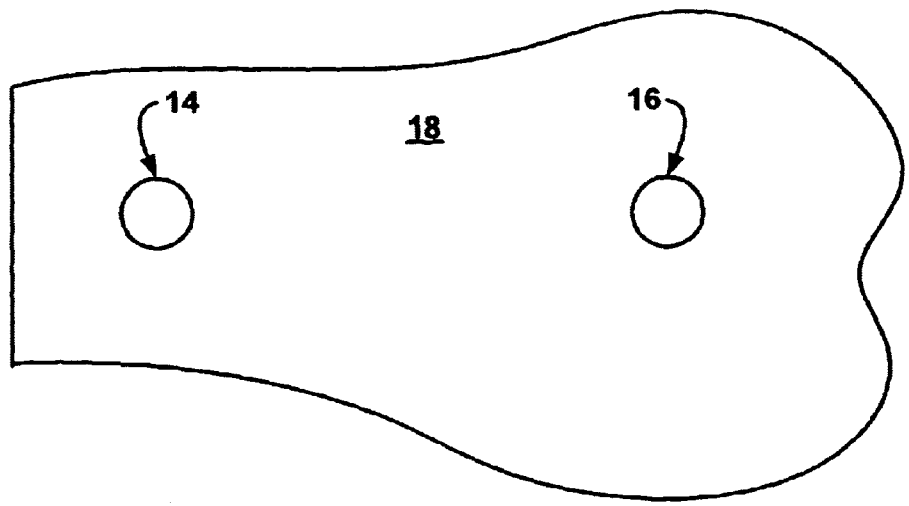
FIG. 7 is a top view of the structure of FIG. 6 in accordance with an embodiment of the present invention.
Figure 8:
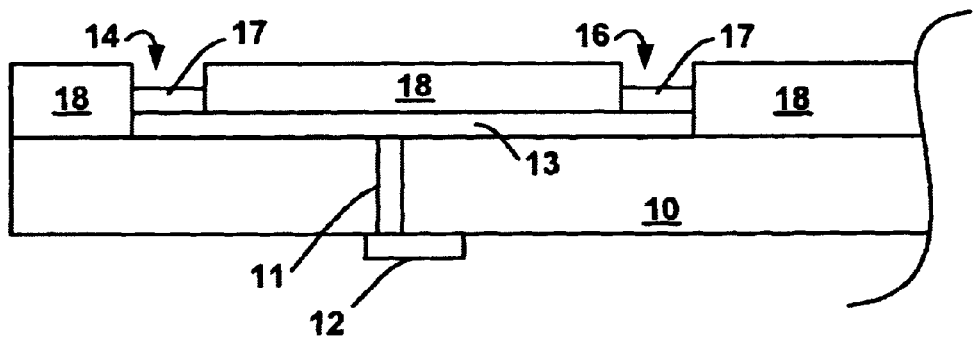
FIG. 8 is a side cross-sectional cut-away view of the structure of FIG. 6 after formation of a hard protective layer that covers bonding pads and contact pads in accordance with an embodiment of the present invention.

Referring back to FIG. 2C, as shown by step 203, a layer of non-conducting material is formed over substrate 10 that includes openings that expose bonding pads and contact pads. In the present embodiment, the layer of nonconducting material is solder mask. In the present embodiment, the solder mask is a plastic material. However, other non-conducting materials could also be used. FIGS. 6–7 show an embodiment in which the non-conducting layer is formed of solder mask (solder mask layer 1B). It can be seen that solder mask layer 18 includes an opening that overlies contact pad 14 so as to expose contact pad 14. Solder mask layer 18 also includes an opening that overlies bonding pad 16 so as to expose bonding pad 16 therethrough.

Continuing with FIG. 2C, as shown by step 204, a layer of hard conductive material is formed over bonding pads and over contact pads. More particularly, a material is used that is sufficiently hard to bond a lead to. FIGS. 6–7 show an embodiment of the present invention in which layer of hard electrically conductive material 17 is formed over contact pad 14 and bonding pad 16. In the present embodiment, layer of hard conductive material 17 is formed by selectively depositing a layer of gold and nickel alloy over bonding pad 17 and contact pad 14.

A cover (e.g., cover 25; FIGS. 2A and 2B) is disposed upon the die and substrate; step 205. The cover may be composed, in one embodiment, of a moldable substance such as a plastic or other polymer. In one embodiment, an organic biphenyl polymer is used to mold the cover which is disposed upon the die and substrate. Covers may also be composed of other materials, such as ceramic, glass, quartz, mica, or metal. Metal covers may require application of layers of electrical insulation. An access portal (e.g., access portal 25; FIGS. 2A and 2B), such as a hole, is formed in the cover. The access portal may be formed by molding, as when a molded cover is fabricated, for example in an injection molding or extrusion process. In one embodiment, the access portal may be drilled, punched, melted, or otherwise formed by penetrating a cover. The access portal allows selective direct access to the die and first pattern of bonding pads underlying the cover in the surface mount package. This selective access allows, in one embodiment, the establishment of an interface with the die and first pattern of bonding pads. The interface may allow interfacing for applications such as signal transfer, for instance, for exchange of data. The interface may also effectuate a testing access, enabling performance evaluation and system debugging. Interfaces may be effectuated by electrical and/or optical interface media. The interface may be permanent, semipermanent, or temporary.

Figure 9:
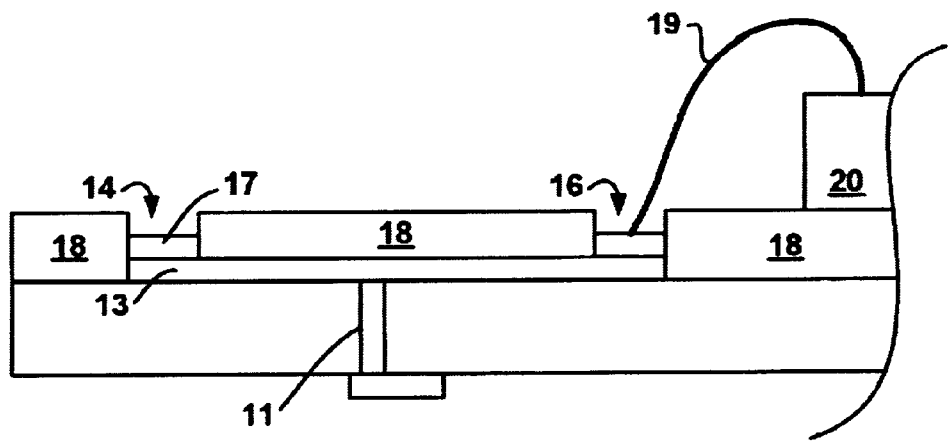
FIG. 9 is a side cross-sectional cut-away view of the structure of FIG. 8 after a semiconductor device has been disposed thereover and after a lead has been used to electrically couple the semiconductor device to a bonding pad in accordance with an embodiment of the present invention.
Figure 10:
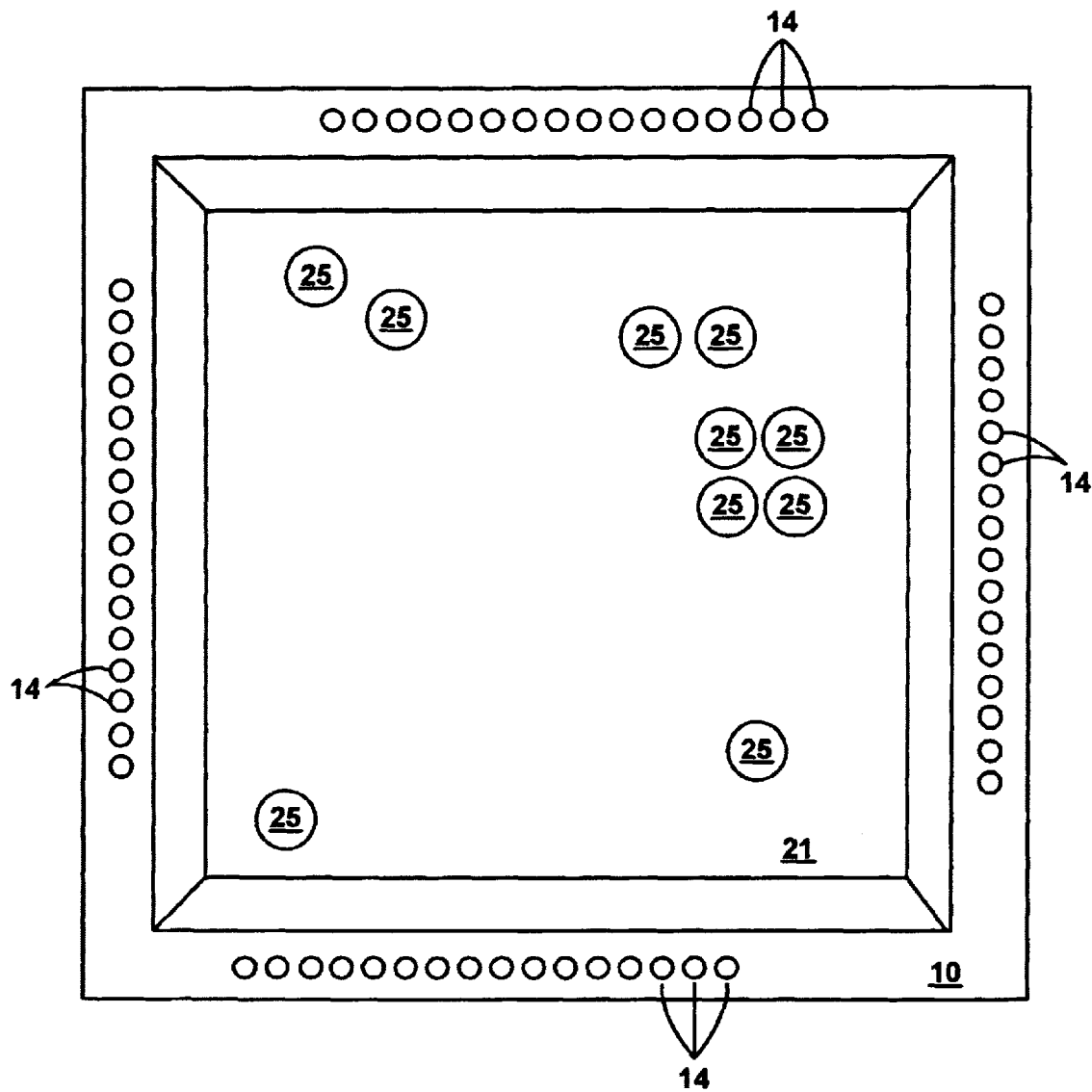
FIG. 10 shows a top view of a completed ball grid array package in accordance with an embodiment of the present invention.

Continuing with FIG. 2C, as shown by step 206, the structure of the surface mount package is then completed. In the present embodiment, the structure is completed by attaching the electronic device deployed by the semiconductor die (e.g., die 20; FIGS. 2A and 2B), forming a cover with access portals therein (e.g., cover 21 and access portals 25, respectively; FIGS. 2A and 2B) over the top of the substrate, disposing conductive balls (e.g., solder balls 22; FIG. 2B) on the bottom of the substrate and trimming the substrate. In the present embodiment which is shown in FIG. 9, an electrical device 20 that is a semiconductor device is attached using a lead 19 that is thermo-acoustically bonded to hard protective layer 17 so as to electrically couple semiconductor device 20 to bonding pad 16. FIG. 10 shows, from a top perspective, the structure of FIGS. 3–9 after cover 21, penetrated by access portals 25, is formed over the top of substrate 10 and after conductive balls 22 have been disposed on the bottom of the substrate so as to form a completed surface mount package 40.

Figure 11:
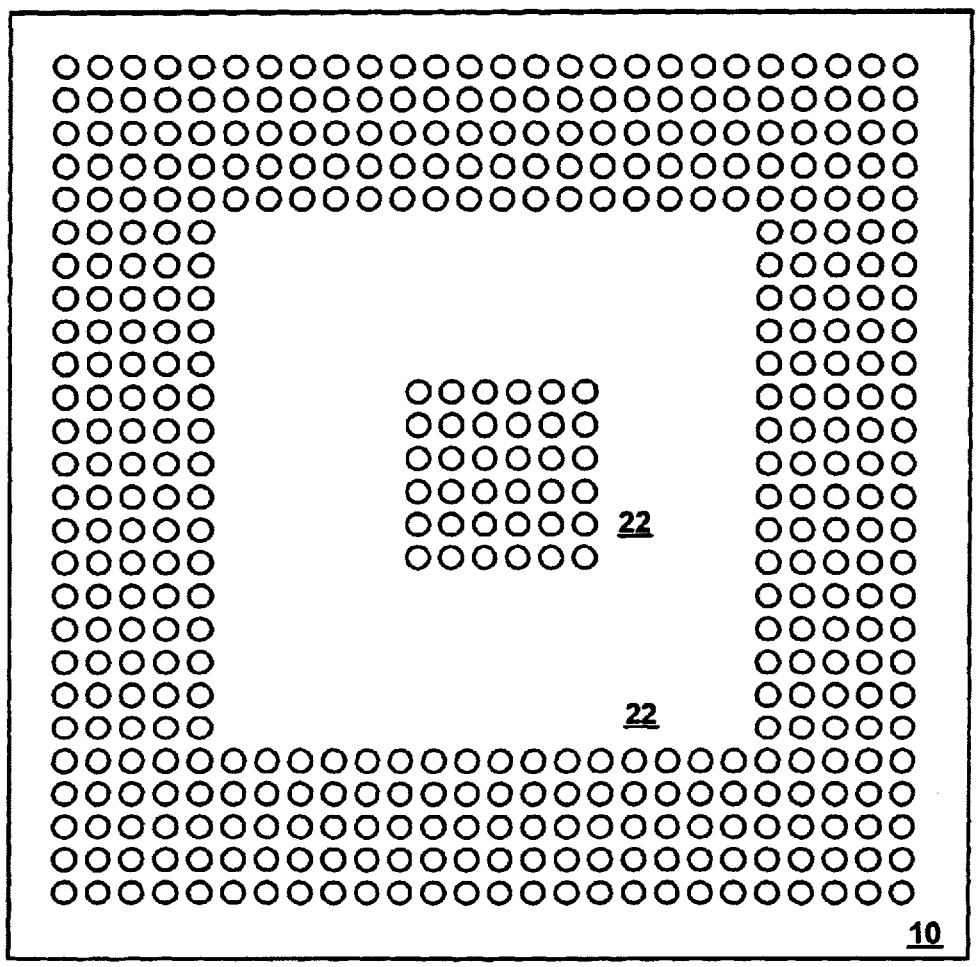
FIG. 11 shows a bottom view of a completed ball grid array package in accordance with an embodiment of the present invention.
Figure 12:
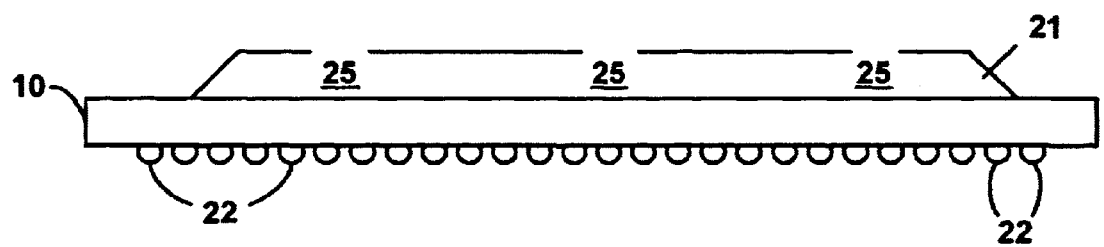
FIG. 12 shows a side view of a completed ball grid array package in accordance with an embodiment of the present invention.

FIG. 11 shows a bottom view of surface mount package 40. It is appreciated that different numbers of conductive balls 22 and different patterns can be used. In addition, any of a number of known methods can be used to form conductive balls 22. In the present embodiment, solder material is used to form conductive balls 22, typically referred to as "solder balls." Also, it is appreciated that conductive balls 22 can be formed at any time after the formation of bonding pads 12 and can be attached either before or after the attachment of housing 21. It is further appreciated that other conductive appurtenances may be deployed. A side perspective of the completed surface mount package is shown in FIG. 12, with access portals illustrated in the top of cover 21.

In the embodiment shown in FIG. 10, it can be seen that contact pads 14 are disposed such that they are not covered by cover 21. This leaves contact pads 14 accessible from the top of the surface mount package. More particularly, contact pads 14 are electrically accessible through contact with the overlying layer of hard conductive material 17 which is exposed on the top surface of surface mount package 40. Therefore, contact pads 14 are easily accessible via contact with the top surface of surface mount package 40. In the present embodiment, only some of the bonding pads are coupled to a contact pad. However, it is appreciated that more or fewer contact pads 14 could be used according to the anticipated testing and/or connectivity needs of the packaged electronic device.

The surface mount package of the present invention can be attached to a circuit board. Once attached to a circuit board, the solder balls or other conductive appurtenances make electrical contact with corresponding circuitry disposed on the circuit board so as to electrically couple the electronic device, deployed by die 20, that is disposed within the surface mount package to the circuit board.

Testing can be easily accomplished while the surface mount package of the present invention is attached to the circuit board via contact with contact pads 14. More particularly, an electrical testing device can touch contact pads 14 for testing the enclosed electrical device. Electrical and/or optical testing can further be effectuated with direct access to components (e.g., semiconductor die 20 and deployed electronic devices thereon laser and photoreceptor diodes 20.1 and 20.2, respectively and other components such as transistors and circuit nodes accessible on the surface of die 20, and bonding pads 16; FIG. 2B) via access portals 25.

Though contact pads 14 and access portals 25 are described as being used for testing purposes, contact pads 14 and access portals 25 may also be used for coupling to an overlying device or devices. This can be accomplished by disposing a device (e.g., system component 39; FIG. 2B) over surface mount package 40 and making electrical contact via contact pads 14, or directly via access portals 25. In addition, contact pads 14 and/or access portals may be used for electrically connecting with devices that do not overlie surface mount array 40.

The contact pads of the surface mount package of the present invention are exposed through the solder mask. Therefore, these contact pads are easily accessible as they are exposed on the top of the surface mount package, or through access portals. Thus, even when the surface mount array is attached to a circuit board, connection with the circuits of the enclosed electrical device can be obtained.

Testing can be easily accomplished while the surface mount package of the present invention is attached to the circuit board via contact with the exposed contact pads, and/or via direct contact with internal components through the access portals. More particularly, an electrical testing device can touch the contact pads and/or die directly, or optically access the die via the access portals for testing the enclosed electronic device.

The exposed contact pads, and/or the access portals could also be used for coupling to an overlying device or devices. This can be accomplished by disposing a device over the surface mount package and by making electrical contact via the exposed contact pads and/or access portals. In one embodiment, the overlying device is an optical transceiver. In addition, the exposed contact pads and/or access portals could be used for electrically coupling to devices that do not overlie the surface mount package.

Because the surface mount package of the present invention allows for easy testing via the exposed contact pads in the top of surface mount package, there is no need to form test pins that extend from the printed circuit board as is required in some prior art applications. Therefore, there are no pins that act as antennas, and no corresponding signal degradation (e.g. reflections, impedance mismatches, etc.) as occurs with conventional devices.

In addition, because the surface mount package of the present invention allows for easy testing via the exposed contact pads in the top of surface mount package and/or the access portals in its cover, there is no need for connecting a testing probe (e.g., an oscilloscope, logic probe, or multimeter) to leads of other devices (that are electrically connected to the surface mount package) for testing the circuits of the electronic device disposed within the surface mount package. Therefore, there is no need to include devices with leads in a circuit board design for the purpose of testing an electrical device housed in a surface mount package as is required in some prior art applications.

Moreover, because the surface mount package of the present invention allows for easy testing via the exposed contact pads in the top of surface mount package, circuit boards can be easily designed for high performance data communication. More particularly, surface mount packages can be included in the circuit board design and conventional features that provide for testing can be eliminated (e.g., test pins that extend from the printed circuit board and devices that include accessible leads), producing a circuit board design that can provide high performance data communication (e.g. data communication signals over 5 giga Hertz (gHz)).

Additionally, the methods of the present invention do not require any additional process steps as compared to prior art surface mount package manufacturing methods. More particularly, cover penetrations may be molded when the cover itself is molded, and contact pads are formed during the conventional step of forming bonding pads and traces on the top of the substrate. Openings that extend above the contact pads are formed in the solder mask during the conventional step of forming openings to expose the bonding pads. Therefore, the methods and apparatus of the present invention provide for connectivity to the enclosed electronic device while not requiring additional process steps as compared to conventional processes. Therefore, the surface mount array housing of the present invention is easily and inexpensively manufactured.

Accordingly, the method and apparatus of the present invention allows for testing of the circuits of a device that is packaged using a surface mount package, in particular via direct access to internal components. In addition, the method and apparatus of the present invention is effective at high frequencies. Moreover the method and apparatus of the present invention does not contribute to signal degradation.

An embodiment of the present invention provides a method and apparatus that effectuates a direct functional interface directly with individual constituent subcomponents of the internal die component, or with particular circuit nodes or conductive trace locales of the surface mount package, without high frequency signal degradation or other electrical problems. An embodiment of the present invention also provides a method and apparatus that effectuates testing access, directly to the internal die component of the surface mount package or to a particular circuit node or conductive trace locale of the surface mount package, enabling performance evaluation and system debugging. Further, an embodiment of the present invention provides a method and apparatus that effectuates integration of surface mount package with an opto-electronic package. Further still, an embodiment of the present invention provides a method and apparatus that achieves these advantages with minimal cost.

An embodiment of the present invention, an apparatus and method for coupling with components in a surface mount package, is thus described. While the invention has been described in conjunction with specific embodiments, it is evident that many alternatives, modifications, permutations and variations will become apparent to those skilled in the art in light of the foregoing description. Accordingly, it is intended that the present invention embrace all such alternatives, modifications and variations as fall within the scope of the appended claims. While the present invention has been described in particular embodiments, it should be appreciated that the present invention should not be construed as limited by such embodiments, but rather construed according to the below claims.

What is claimed is:

1. A package for an electronic device, said package comprising:

a substrate having a pattern of conductive traces thereon, said conductive traces electrically coupled to an upper pattern and a lower pattern of conductive bonding pads, said lower pattern of bonding pads electrically connected to an array of conductive appurtenances;

a semiconductor die electrically coupled to said upper pattern of bonding pads, said semiconductor die deploying said electronic device; and a cover disposed upon said die and said substrate, said cover having an access portal to said semiconductor die disposed through said cover, wherein said access portal effectuates direct access selectively to said semiconductor die and to said upper pattern of said bonding pads.

2. The package as recited in claim 1, wherein said cover comprises a molded material.

3. The package as recited in claim 2, wherein said cover comprises a polymeric material.

4. The package as recited in claim 2, wherein said access portal comprises an opening, said opening formed upon molding said cover, said opening disposed completely through said cover.

5. A surface mount package for an electronic device, said surface mount package comprising:

a substrate having a pattern of conductive traces thereon, said conductive traces electrically coupled to an upper pattern and a lower pattern of conductive bonding pads, said lower pattern of bonding pads electrically connected to an array of conductive appurtenances;

a semiconductor die electrically coupled to said upper pattern of bonding pads, said semiconductor die deploying said electronic device; and a cover disposed upon said die and said substrate, said cover including an access portal to said semiconductor die, wherein said access portal effectuates direct access selectively to said semiconductor die and to said upper pattern of said bonding pads.

6. The surface mount package as recited in claim 5, wherein said cover comprises a molded material.

7. The surface mount package as recited in claim 5, wherein said cover comprises a polymeric material.

8. The surface mount package as recited in claim 5, wherein said access portal comprises an opening.

9. The surface mount package as recited in claim 8, wherein said opening is formed upon molding said cover.

10. A method for forming a surface mount package for an electronic device, said method comprising:

forming an interconnect structure on a substrate;

forming a first pattern of bonding pads over the top of said substrate, said first pattern of bonding pads electrically coupled to said interconnect structure;

disposing a semiconductor die over said substrate, said semiconductor die deploying an electronic device, said electronic device electrically coupled to said first pattern of bonding pads;

forming a second pattern of bonding pads on the bottom of said substrate, said second pattern of bonding pads electrically coupled to said interconnect structure;

arraying a plurality of conductive appurtenances beneath the bottom of said substrate, said plurality of conductive appurtenances electrically coupled to said second pattern of bonding pads;

disposing a cover upon said die and said substrate; and forming an access portal in said cover, wherein said portal effectuates selectively accessing said die and said first pattern of bonding pads via said access portal.

11. The method as recited in claim 10, wherein said selectively accessing said die and said first pattern of bonding pads via said access portal further comprises establishing an interface with said die.

12. The method as recited in claim 11, wherein said interface is selected from the group consisting of permanent, semi-permanent, and temporary interfaces.

13. The method as recited in claim 11, wherein said interface is selected from the group consisting of electrical and optical interfaces.

14. The method as recited in claim 11, wherein said interface is effectuated by a medium selected from the group consisting of probes, electron beams, laser beams, pogo pin connectors, fuzz ball connectors, and metallic dendrite connectors.

* * * * *